United States Patent
Tong et al.

(10) Patent No.: US 6,846,719 B2
(45) Date of Patent: Jan. 25, 2005

(54) PROCESS FOR FABRICATING WAFER BUMPS

(75) Inventors: Ho-Ming Tong, Taipei (TW); Chun-Chi Lee, Kaohsiung (TW); Jen-Kuang Fang, Pingtung Hsien (TW); Min-Lung Huang, Koahsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsing Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,804

(22) Filed: Feb. 20, 2003

(65) Prior Publication Data

US 2003/0162362 A1 Aug. 28, 2003

(30) Foreign Application Priority Data

Feb. 26, 2002 (TW) .......................................... 91103380 A

(51) Int. Cl.$^7$ ............................................... H01L 21/76
(52) U.S. Cl. ........................ 438/411; 257/734; 257/735; 257/736
(58) Field of Search .................... 438/411; 257/734–738

(56) References Cited

U.S. PATENT DOCUMENTS

| | | | |
|---|---|---|---|
| 5,106,035 A | | 4/1992 | Langford, III |
| 5,470,787 A | * | 11/1995 | Greer .......................... 438/614 |
| 5,796,591 A | * | 8/1998 | Dalal et al. .................. 361/779 |
| 5,810,284 A | | 9/1998 | Hibbs et al. |
| 5,946,590 A | * | 8/1999 | Satoh .......................... 438/613 |
| 6,426,556 B1 | * | 7/2002 | Lin ............................. 257/738 |
| 6,550,717 B1 | | 4/2003 | MacCready et al. |
| 6,568,633 B2 | | 5/2003 | Dunn |
| 6,586,323 B1 | * | 7/2003 | Fan et al. .................... 438/614 |
| 2001/0033020 A1 | * | 10/2001 | Stierman et al. ............ 257/737 |
| 2002/0114985 A1 | | 8/2002 | Shkolnik et al. |
| 2002/0173134 A1 | * | 11/2002 | Viswanadam et al. ...... 438/613 |
| 2003/0067073 A1 | * | 4/2003 | Akram et al. ............... 257/738 |
| 2003/0116845 A1 | * | 6/2003 | Bojkov et al. .............. 257/738 |
| 2003/0205641 A1 | | 11/2003 | McElroy et al. |

\* cited by examiner

*Primary Examiner*—Long Pham
*Assistant Examiner*—Nathan W. Ha
(74) *Attorney, Agent, or Firm*—Jiang Chyun IP Office

(57) ABSTRACT

A wafer bump fabrication process is provided in the present invention. A wafer with multiple bonding pads and a passivation layer, which exposes the bonding pads, is provided. The surface of each bonding pad has an under bump metallurgy layer. A patterned photoresist layer with a plurality of opening is formed which openings expose the under bump metallurgy layer. Afterwards a curing process is performed to cure the patterned photoresist layer. Following a solder paste fill-in process is performed to fill a solder paste into the openings. A reflow process is performed to form bumps from the solder paste in the openings. The patterned photoresist layer is removed.

18 Claims, 9 Drawing Sheets

PROCESS FOR FABRICATING WAFER BUMPS

CROSS REFERENCE TO RELATED APPLICATIONS

This application claims the priority benefit of Taiwan application serial No. 91103380 filed on Feb. 26, 2002.

BACKGROUND OF THE INVENTION

1. Field of the Invention

The present invention is generally related to a wafer bump fabrication process, and more particularly to a high-lead-content wafer bump fabrication process.

2. Description of Related Art

Semiconductor packaging technology is advancing in the direction of miniaturization and high integration. In terms of high integration techniques such as flip chip, it reduces signal path length for improving signal transmission speed therefore flip chip has become the main method in high integration packaging.

Conventional flip chip techniques usually involve in the processes after redistribution is completed, that is the formation of bumps on the input/output (IO) bonding pads of the wafer. After the singulation of the wafer into chips, the chips are flipped and directly attached to the substrate via the bumps. In order to improve the connection between the bumps and the substrate, a solder paste made containing tin and lead is first coated on the surface of the substrate. Following, after the connection points of the bumps and the substrate are connected, a reflow process is performed to soften the solder paste to complete the connection.

For preventing the bumps and the solder paste from softening together during the flipped chip and substrate connection, a method using high-lead-content bumps is proposed. By using bumps having higher lead content than the solder paste coated on the substrate, the bumps will not soften and deform under the temperature used in the reflow process. However if the lead content of the bumps is increased, correspondingly the temperature used in the reflow process needs to be increased. Such high reflow process temperature (during the formation of the balls) causes a lot of problems which are demonstrated in the followings.

Please refer to FIG. 2-6 and simultaneously refer to FIG. 1 as well, FIG. 2-6 show the schematic sectional view of the bump fabrication process and FIG. 1 show the flow chart of the bump fabrication process.

As illustrated in FIG. 2, a plurality of bonding pads 102 and a passivation layer 104 are located on a wafer 100, where the passivation layer 104 protects the wafer 100 and exposes the bonding pads 102. After an under ball metallurgyunder bump metallurgy (UBM) layer 106 is formed on the bonding pads 102, a dry film (step 122 in FIG. 1) is adhered to the surface of the wafer 100 and then cure to become 108a. Afterwards a curing process (step 124 in FIG. 1) is performed to cure the dry film.

As illustrated in FIG. 3, an exposure development process (step 126 in FIG. 1) is performed to the dry film 108a to form patterned dry film 108b which has a plurality of openings 108c for exposing the UBM layer 106. Afterwards a plasma etching process (step 132 in FIG. 1) is performed to remove the native oxide which is formed on the surface of the UBM layer 106 during the exposure of the UBM layer 106 and to also remove any remaining of the exposure development in the openings 108c. Following, a screen printing process (step 134 in FIG. 1) is performed to fill openings 108c with the solder paste 110 to achieve the structure in FIG. 4, wherein the solder paste mainly comprises solder alloy and flux.

As illustrated in FIG. 5, a reflow process (step 136 in FIG. 1) is performed to increase the temperature to soften the solder paste 110 and to form bumps 110a using the surface tension of the solder paste 110. Afterwards the dry film 108b (step 138 in FIG. 1) is removed as illustrated in FIG. 6, by using the flux in the solder paste to take away the oxide and other contaminants in the ball-shaped bumps to the surface of the ball-shaped bumps, so the bumps become 110b and the reflex becomes 112a. Finally, the flux 112a is removed (step 144 in FIG. 1) and the ball-shaped bumps 110b (not shown) are left.

It is to be noted that when adhering the dry film, if air bubbles exist between the wafer and the dry film the air bubbles will be trapped inside the dry film after the curing process. Afterwards in the exposure development process, the air bubbles still cannot be released. As a result in the subsequent fabrication process until the reflow process which is after filling in the solder paste, problems will occur which are described in details in FIGS. 7-8.

Please refer to FIG. 7, it shows a schematic sectional view of the conventional bump fabrication process during the reflow process with air bubbles exist in the dry film. Wherein reference number 170 represents a wafer, reference number 172 represents a bonding pad, reference number 174 represent a passivation layer, and reference number 176 represents an under ball metallurgyunder bump metallurgy (UBM) layer. If air bubble 173 exists during the adhesion of the dry film, the air bubble 173 will be trapped during the curing process all the way until the solder paste is filled inside the opening 178a and therefore the air bubble 173 is permanently trapped with no escape.

Please refer to FIG. 8, it shows the adverse effects generated by the air bubbles during the reflow process for the structure in FIG. 7. During the reflow process, increasing temperature causes the air bubble 173 to expand in volume to become 173a. If the location of the air bubble 173 is near the opening 178a, the expanded air bubble 173a will push the solder paste 180 to deform and become 180b. As this moment, the solder paste 180b will peel off from the surface of the UBM layer 176 and therefore cannot form ball-shaped bumps 180a, this phenomenon is known as bump missing.

Besides the above described problems, after the dry film is cured the curing of the dry film is adverse so in subsequent screen printing the dry film is easily subjected to deformation which introduces the problem of bump bridge, details are described in FIGS. 9-10.

Please consecutively refer to FIGS. 9 and 10, they show the adverse effect of bump birdge during the conventional bump fabrication process. Wherein reference number 150 represents a wafer, reference number 152 represents a solder pad, reference number 154 represents a solder passivation layer, and reference number 156 represents an under ball metallurgyunder bump metallurgy (UBM) layer. After the conventional curing process, the curing effect of the dry film 160 is not enough so the blade 161 will exert pressure on the dry film 160 causing it to deform and create bump bridge, as illustrated in FIG. 10.

Furthermore the adverse result of the curing can cause other problems. Solder paste is usually made of a combination of flux and solder material, therefore if the curing of the dry film is adverse, the dry film will absorb more flux. In the reflow process, the flux that is absorbed into the dry film will react and form some unwanted reacted material making the dry film hard to be removed.

Summarizing the above, the conventional bump fabrication process has the following disadvantages:

1. Due to the existence of air bubbles between the dry film and the wafer, ball-shaped bumps cannot be formed in the reflow process.

2. Due to the adverse result of the curing of the dry film, the dry film is easily deformed causing bump bridge.

3. The dry film absorbs the flux making the dry film hard to be removed.

SUMMARY OF THE INVENTION

The present invention provides a bump fabrication process which can improve production yield.

The present invention provides a bump fabrication process which can release the air bubbles allowing the reflow process to successfully form bumps.

The present invention provides a bump fabrication process which can eliminate bump bridge.

The present invention provides a bump fabrication process which can easily remove the dry film.

For solving the disadvantages found in the prior art and achieving the aforementioned objects and other objects, the present invention provides a wafer bump fabrication process which comprises a wafer, a plurality of bonding pads, and a passivation layer which covers the surface of the wafer but exposes the bonding pads. The surface of each solder pad further has a under bump metallurgy (UBM) layer. A patterned photoresist layer is formed on the surface of the wafer, wherein the patterned photoresist layer has a plurality of openings for exposing the UBM layer. Afterwards, a curing process is performed to cure the patterned photoresist layer. Following, a solder paste filling process is performed to fill a solder paste into the openings. Then a reflow process is performed so that the solder paste in the openings become a plurality of bumps. Finally the patterned photoresist layer is removed.

The present invention provides a wafer bump fabrication process, wherein the main component of the solder paste is a flux, the wafer bump fabrication process further comprises: performing a second reflow process which uses the flux to bring the oxide of the bumps from inside to the surface of the bumps. Afterwards the flux is removed.

According to the characteristics of the present invention, if air bubbles exist between the wafer and the patterned photoresist layer during the formation of the patterned photoresist layer, the curing process can successfully release the air bubbles via nearby openings in the patterned photoresist layer after the openings are formed in the patterned photoresist layer.

According to the characteristics of the present invention, the curing process can increase the effect of the curing of the patterned photoresist layer so the patterned photoresist layer will not easily deform.

According to the characteristics of the present invention, the curing process can decrease the height of the patterned photoresist layer so the adhesion between the patterned photoresist layer and the wafer is increased. The absorption of the flux by the patterned photoresist layer is therefore reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 11:
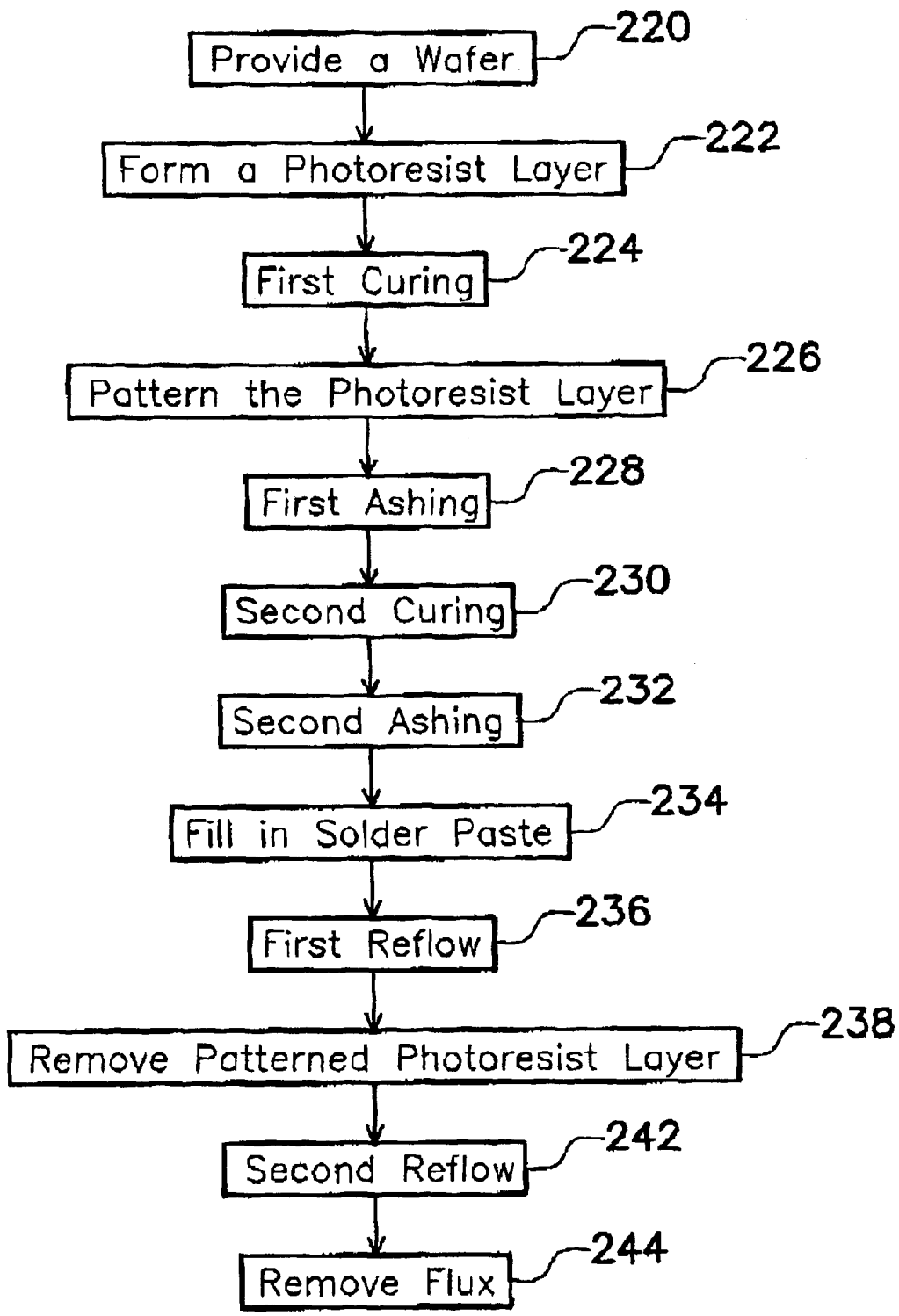
FIG. 11 is a flow chart of the wafer bump fabrication process according to one preferred embodiment of the present invention.

Please refer to FIGS. 12–23 in order and simultaneously refer to FIG. 11, wherein FIGS. 12–23 are schematic sectional view of the wafer bump fabrication process and FIG. 11 is a flow chart of the wafer bump fabrication process.

Figure 1:
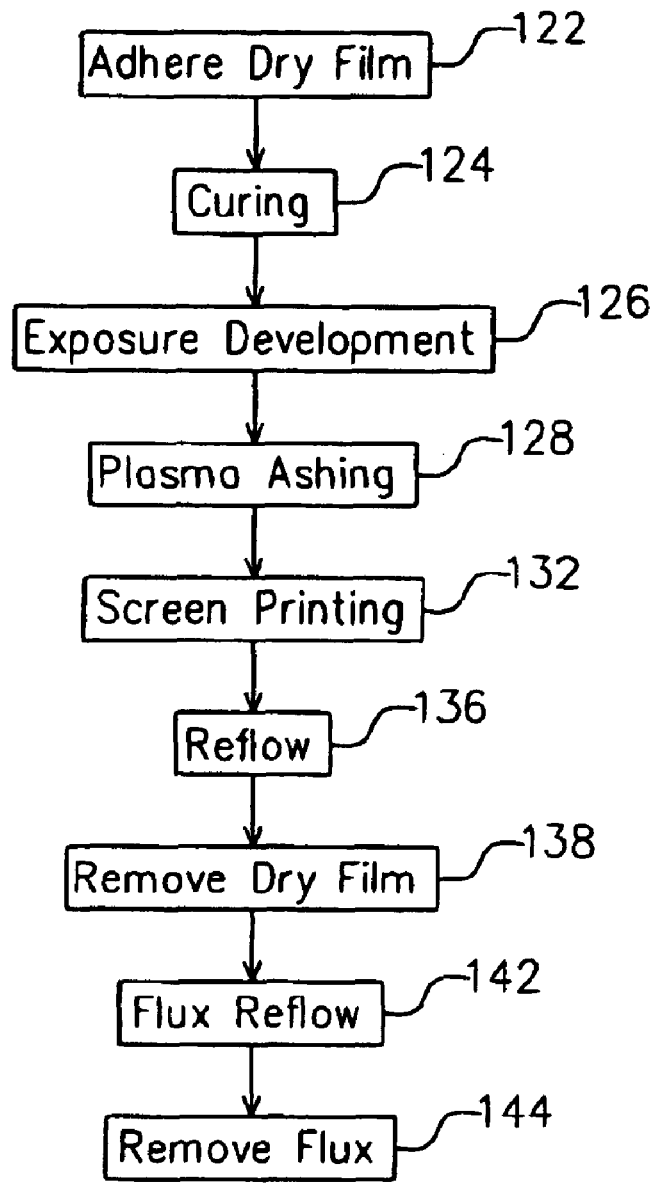
FIG. 1 is a flow chart of the conventional wafer bump fabrication process.
Figure 2:
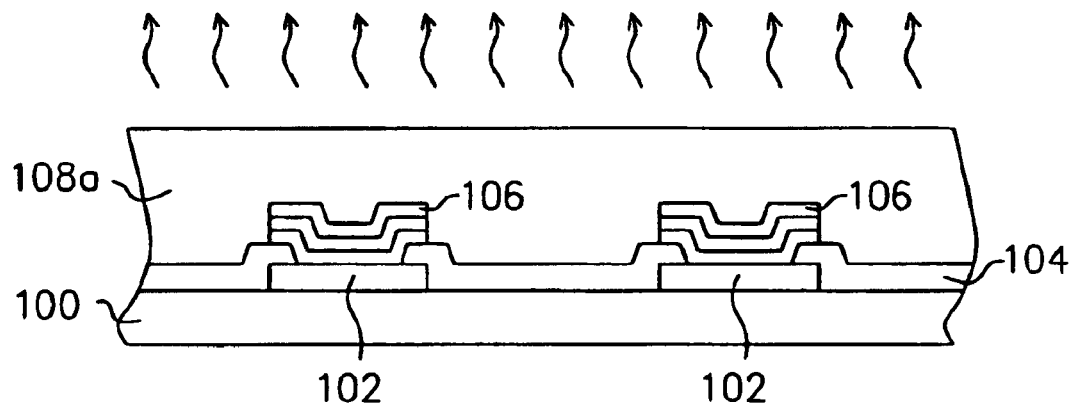
FIGS. 2–6 are schematic sectional view of the conventional wafer bump fabrication process.
Figure 3:
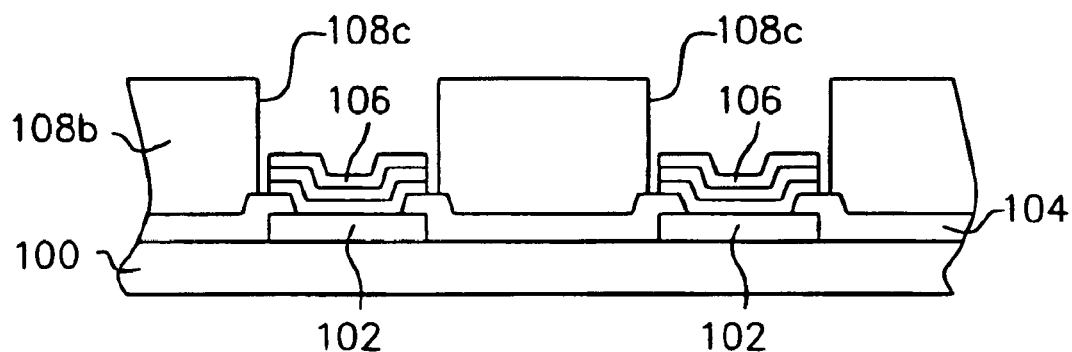
Figure 4:
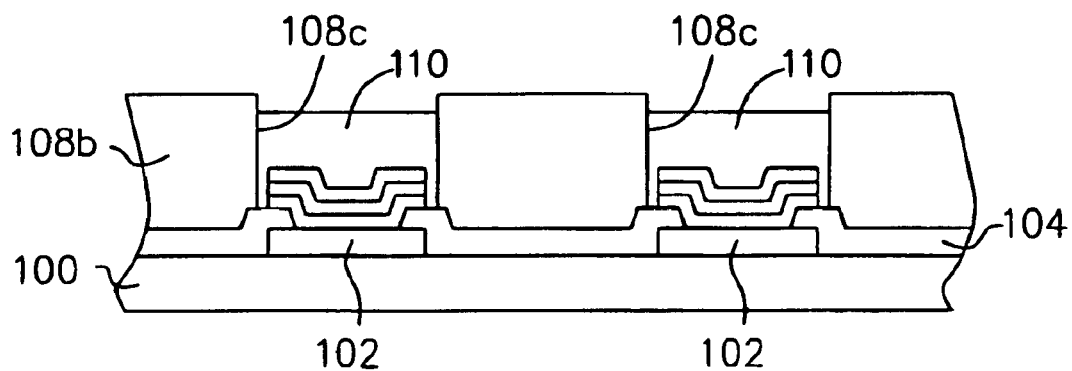
Figure 5:
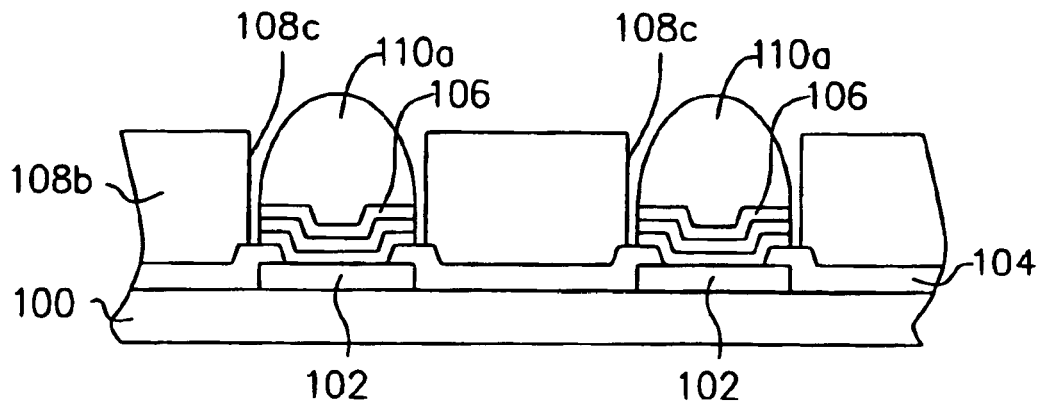
Figure 6:
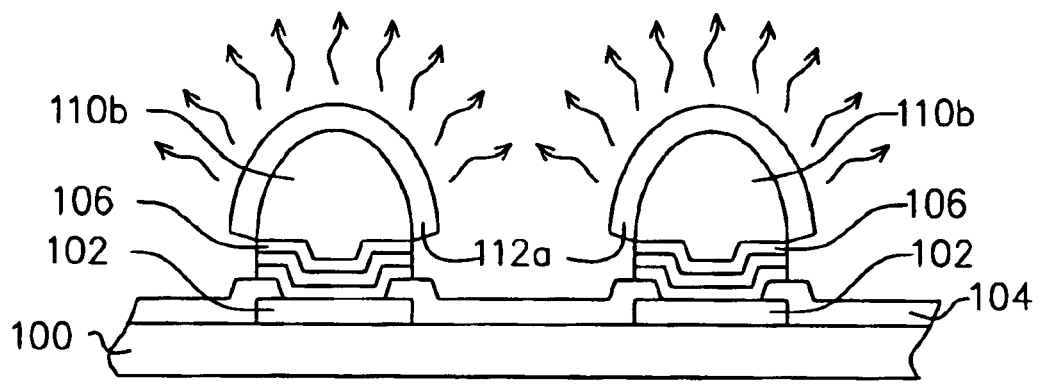
Figure 7:
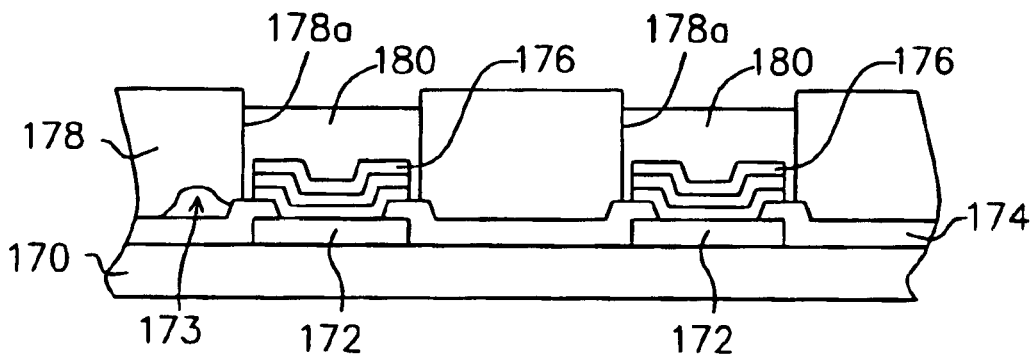
FIGS. 7–8 are schematic sectional view of the conventional wafer bump fabrication process showing the generation of air bubbles.
Figure 8:
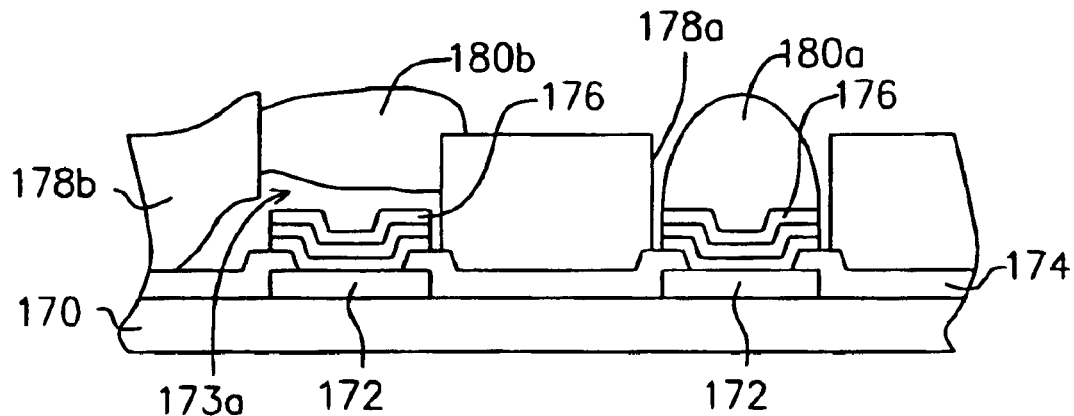
Figure 9:
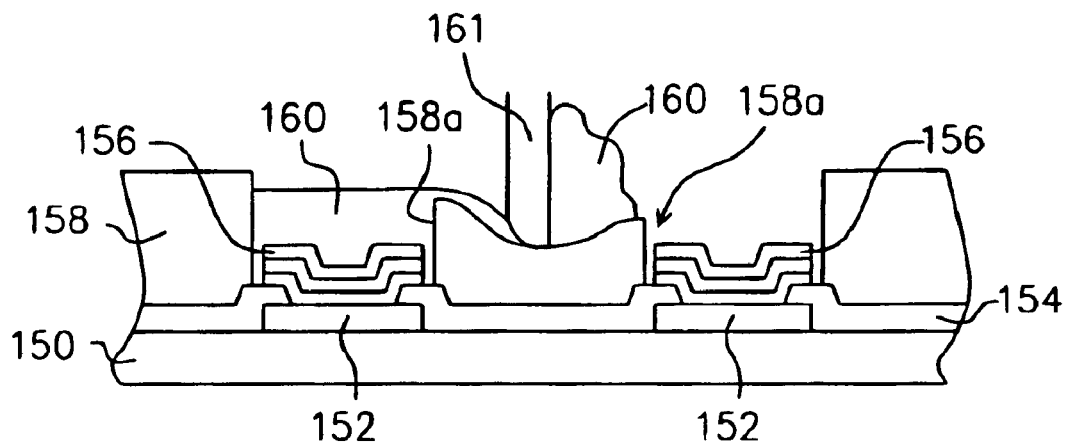
FIGS. 9–10 are schematic sectional view of the conventional wafer bump fabrication process showing the generation of bump bridge due to adverse curing.
Figure 10:
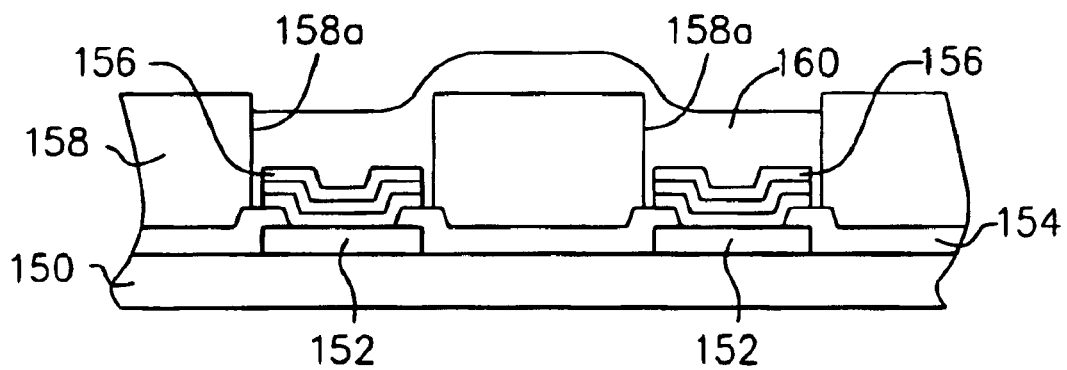
Figure 12:
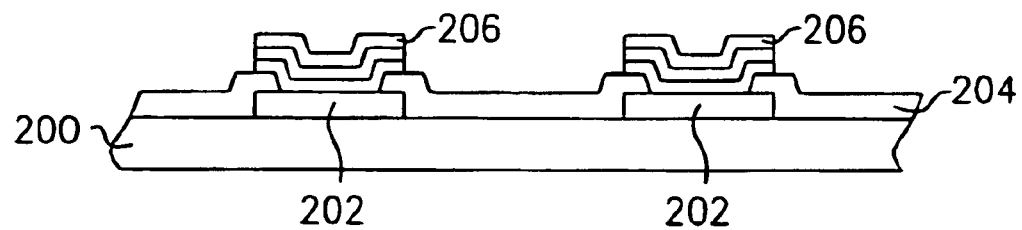
FIGS. 12–23 are schematic sectional view of the wafer bump fabrication process according to one preferred embodiment of the present invention.
Figure 13:
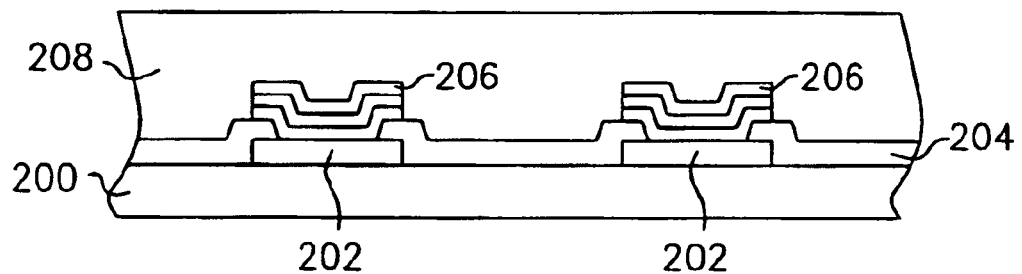

As illustrated in FIG. 12, a wafer 200 (step 220 in FIG. 1) is provided with a plurality of bonding pads 202 and a passivation layer 204 which covers the surface of the wafer 200 but exposes the bonding pads 202. Wherein the surface of each solder pad 202 has an under bump metallurgy (UBM) layer 206. The material for example for the UBM layer 206 comprises: chromium, titanium tungsten alloy, copper, nickel, chromium nickel alloy, nickel vanadium alloy, nickel gold alloy, or the like. Following in FIG. 13, a photoresist layer 208 is formed on the wafer 200 (step 222 in FIG. 1) covering the UBM layer 206 and the surface of the passivation layer 204.

Figure 14:
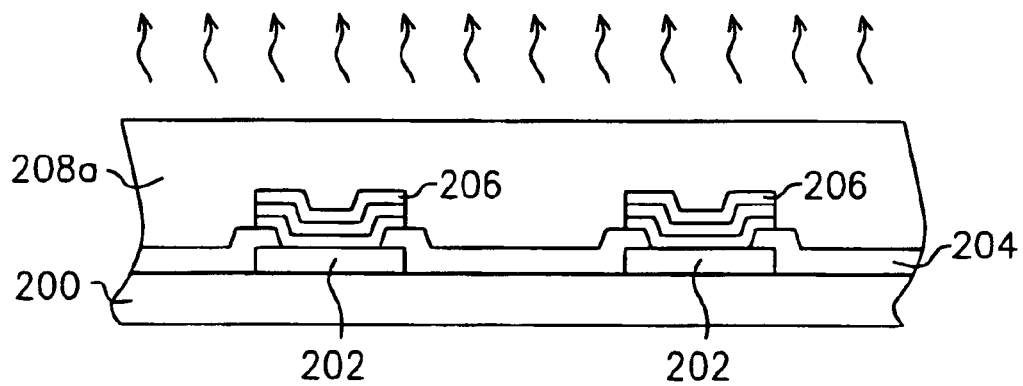
Figure 15:
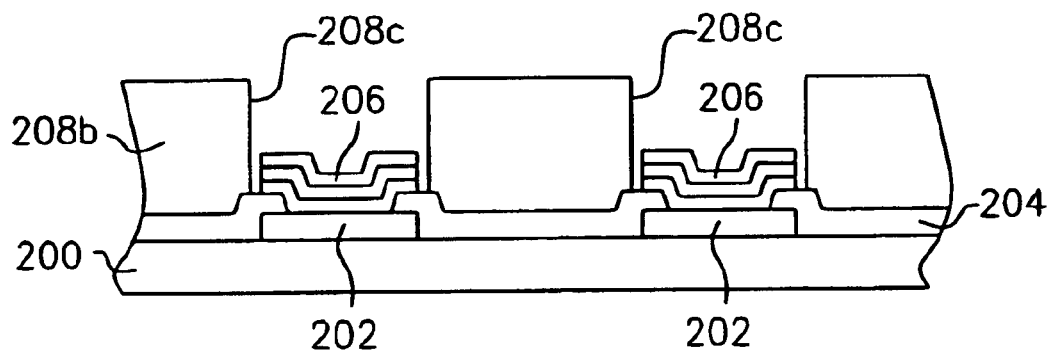

Afterwards as illustrated in FIG. 14, a first curing process (step 224 in FIG. 1) is performed to cure the photoresist layer 208 into 208a. As illustrated in FIG. 15, the photoresist layer 208a is patterned (step 226 in FIG. 11) to form a patterned photoresist layer 208b where the patterned photoresist layer 208b has a plurality of openings 208c for exposing the UBM layer 206. The size of the openings is approximately 100–300 $\mu$m.

Figure 16:
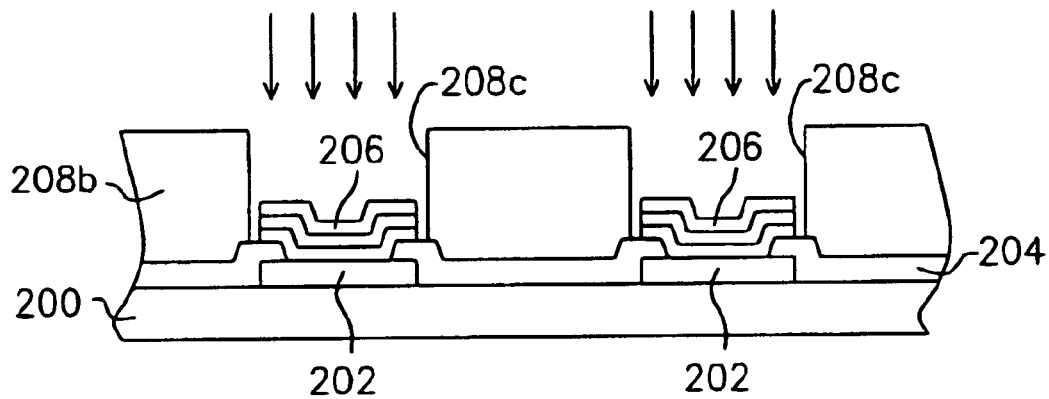
Figure 17:
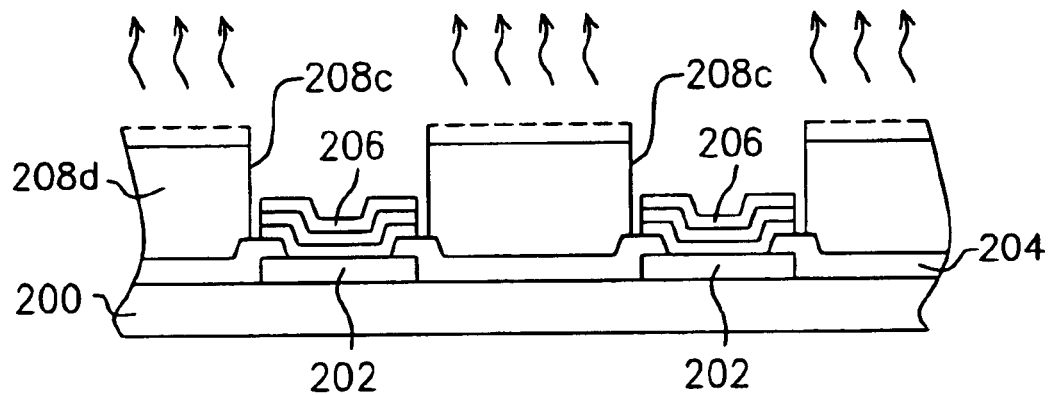

Following as illustrated in FIG. 16, a first ashing process (step 228 in FIG. 1) is performed for example by plasma etching to remove the oxide formed on the surface of the UBM layer. As illustrated in FIG. 17, a second curing process (step 230 in FIG. 11) is performed to cure the patterned photoresist layer 208b which also serves to lower the height (reduction of about 1–5 $\mu$m) to 50–100 $\mu$m to become 208d. As illustrated in the diagram, the reduction in the height of the patterned photoresist layer is shown by an actual line indicating the original height and a dotted line indicating the reduced height. The conditions for performing the second curing process are for example putting the wafer 200 in a nitrogen environment, controlling the amount of nitrogen less than 20 ppm, and controlling the temperature of the wafer 200. The temperature control is achieved by allowing the temperature of the wafer 200 to increase from room temperature to 180–230 degrees Celsius and decrease back to room temperature spanning a time of approximately 5–30 minutes.

Figure 18:
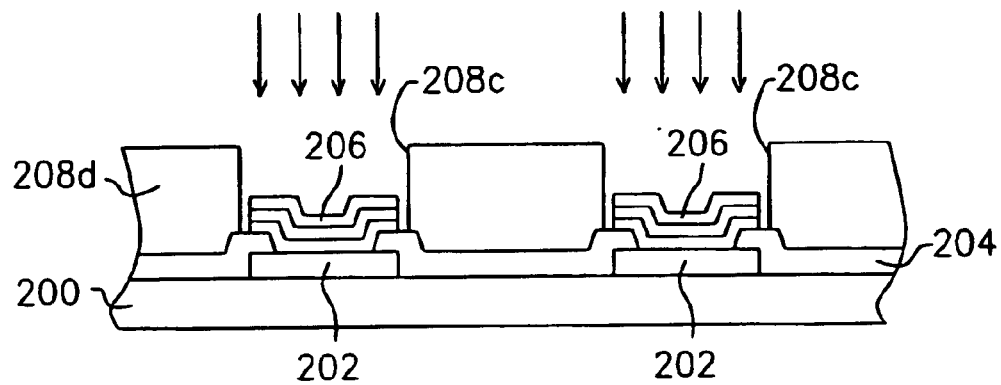
Figure 19:
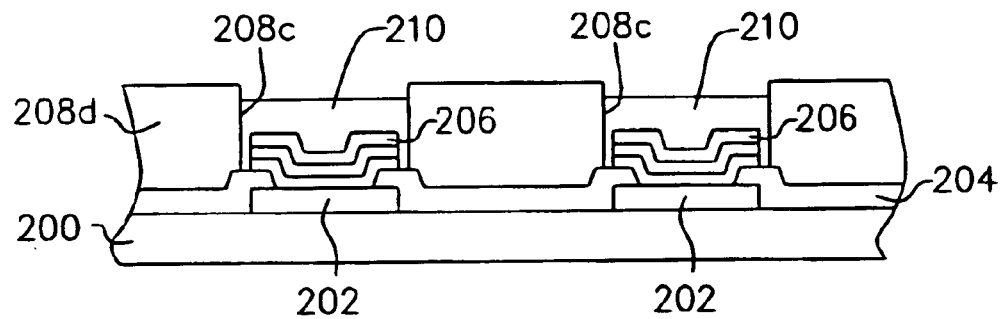

After the curing process in FIG. 18, a second ashing process (step 232 in FIG. 11) is performed for example by plasma etching to remove the oxide on the surface of the UBM layer 206. Because the openings 208c are exposed, the surface of the UBM layer 206 form an oxide-like object. Following in FIG. 19, a solder filling process (step 234 in FIG. 11) is performed to fill a solder paste 210 into the openings 208c. The material of the solder paste 210 mainly comprises tin lead alloy and flux and the method for filling in the solder paste 210 comprises screen printing.

Figure 20:
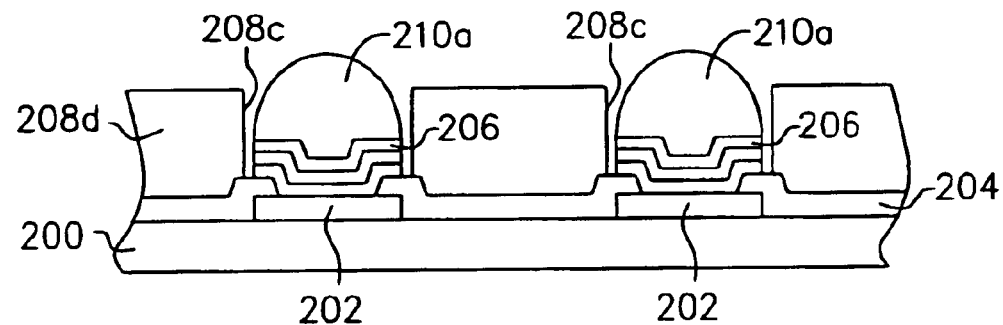
Figure 21:
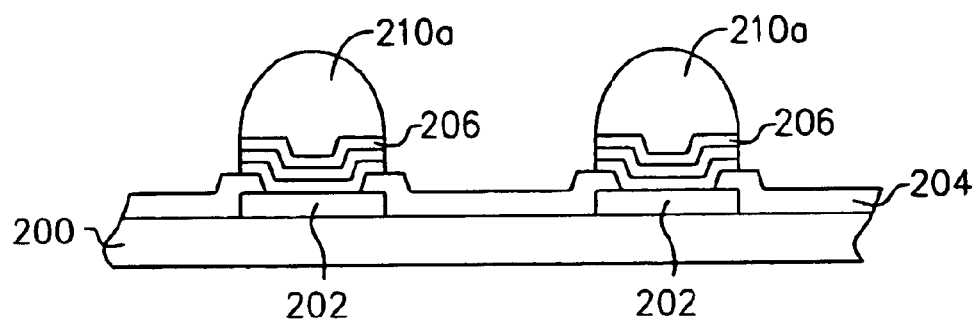

Afterwards in FIG. 20, a reflow process (step 236 in FIG. 11) is performed to form the bumps 210a from the solder paste 210 in the openings 208c. Thereafter in FIG. 21, the patterned photoresist layer 208d is removed (step 238 in FIG. 11) but remaining the bumps 210a. The conditions for performing the reflow process are for example to put the wafer 200 in a nitrogen environment, controlling the amount of nitrogen less than 20 ppm, and controlling the temperature of the wafer 200. The temperature control is achieved by allowing the temperature of the wafer 200 to increase from room temperature to 317–360 degrees Celsius and back to room temperature spanning a time of approximately 3–20 minutes.

Figure 22:
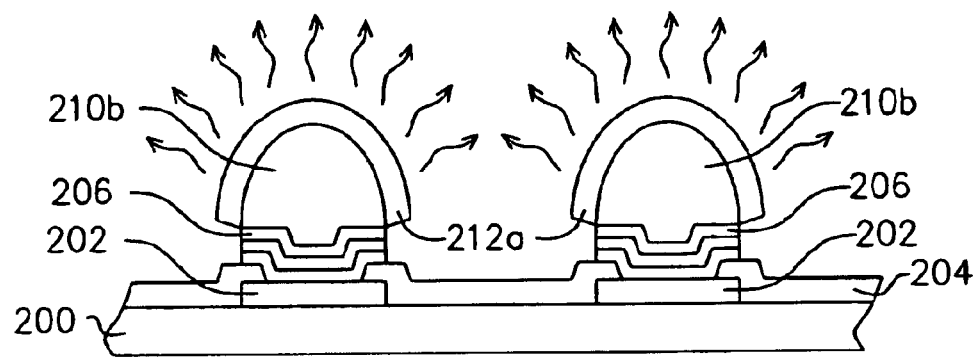
Figure 23:
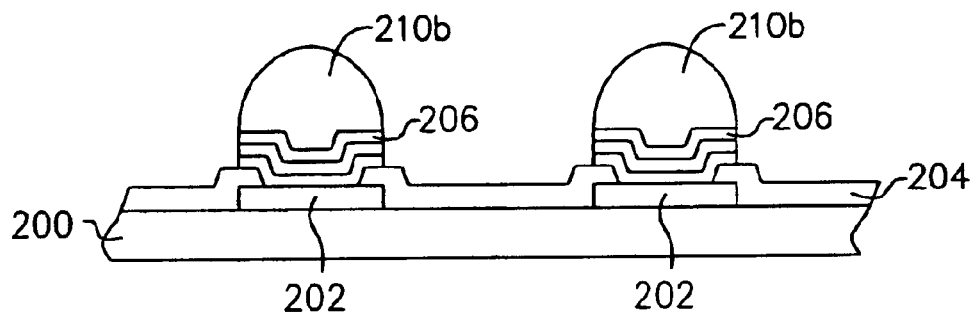

In order to remove the unnecessary oxide and contaminants in the bumps 210a, the following steps will be performed. As illustrated in FIG. 22, a second reflow process (step 242 in FIG. 11) is performed. By using the solder paste containing flux to bring the contaminants and oxide existing in the bumps 210a from inside to a surface of the bump, the flux will become 212a and the bumps will change to 210b from 210a. Finally in FIG. 23, the flux 212a is removed (step 244 in FIG. 11).

The above-mentioned first ashing process is not absolutely necessary. It may only need one ashing process being performed before the solder paste is filled in. Therefore the first ashing process can be skipped and only use the second ashing process to remove the native oxide on the surface of the UBM layer before the filling in of the solder paste when removing the photoresist layer in the openings of the patterned photoresist layer.

According to the characteristics of the present invention, after the formation of the patterned photoresist layer (that is after the openings are formed in the photoresist layer) and the curing process, if air bubbles exist between the patterned photoresist layer and the wafer, the air bubbles can escape through the nearby openings in the patterned photoresist layer. Therefore, the occurrence of bump missing is reduced because the problem of solder paste peeling off from the UBM layer, due to air bubble expansion, is relieved.

According to the characteristics of the present invention, after the formation of the patterned photoresist layer (that is after the openings are formed in the photoresist layer) and the curing process, the occurrence of bump bridge is reduced because the curing of the patterned photoresist layer is improved. As a result, the patterned photoresist layer will not be easily deformed during a screen printing process.

According to the characteristics of the present invention, the curing process facilitates the reduction in height of the patterned photoresist layer to improve the adhesion between the patterned photoresist layer and the wafer, that is to prevent the formation of big air bubble. Furthermore the absorption of flux by the patterned photoresist layer is reduced to prevent the formation of reacted material between the patterned photoresist layer and the flux which helps in the removal of the patterned photoresist layer.

According to the preferred embodiment of the present invention, the present invention presents the following advantages:

1.) According to the characteristics of the present invention, by performing a curing process on the patterned photoresist layer, the occurrence of bump missing is reduced because the problem of solder paste peeling off from the UBM layer, due to air bubble expansion, is relieved.

2.) According to the characteristics of the present invention, by performing a curing process on the patterned photoresist layer, the occurrence of bump bridge is reduced.

3.) According to the characteristics of the present invention, by performing a curing process on the patterned photoresist layer, the adhesion between the patterned photoresist layer and the wafer is increased so that the large air bubbles cannot be easily formed. Also and, the removal of the patterned photoresist layer is much easier.

It will be apparent to those skilled in the art that various modifications and variations can be made to the structure and method of the present invention without departing from the scope or spirit of the present invention. In view of the foregoing description, it is intended that the present invention covers modifications and variations of this invention provided they fall within the scope of the following claims and their equivalents.

What is claimed is:

1. A wafer bump fabrication process comprising:
    providing a wafer comprising a plurality of bonding pads and a passivation layer on a surface of the wafer, wherein the passivation layer exposes the bonding pads and a surface of each bonding pad has an under bump metallurgy layer;
    forming a patterned photoresist layer on the surface of the wafer, wherein the patterned photoresist layer has a plurality of openings that expose the under bump metallurgy layer;
    performing a curing process to cure the patterned photoresist layer after the openings are formed therein;
    performing a first ashing process after the curing process to remove oxide formed on a surface of the under bump metallurgy layer;
    performing a solder paste fill-in process to fill the solder paste into the openings;
    performing a first reflow process to form a plurality of bumps from the solder paste within the openings; and
    removing the patterned photoresist layer.

2. The method of claim 1, wherein and the method further comprises:
    performing a second reflow process to bring oxide from inside of the bumps to a surface of the bumps by a flux that is included in the solder paste; and
    removing the flux.

3. The method of claim 1, wherein after forming the patterned photoresist layer further comprising:
    performing a second ashing process to clean the openings.

4. The method of claim 3, wherein the solder paste comprises a flux and the method further comprises:
    performing a second reflow process to bring oxide from inside of the bumps to a surface of the bumps by the flux; and
    removing the flux.

5. The method of claim 1, wherein the curing process is performed for a duration of about five minutes to about thirty minutes in a nitrogen environment by controlling the amount of nitrogen less than 20 ppm, and heating the wafer to a temperature of about 180 degrees to about 230 degrees in Celsius.

6. The method of claim 1, wherein the reflow process is performed for a duration of about five minutes to about thirty minutes in a nitrogen environment by controlling the amount of nitrogen less than 20 ppm, and heating the wafer to a temperature of about 180 degrees to about 230 degrees in Celsius.

7. The method of claim 1, wherein a material of the under bump metallurgy layer includes one selected from the group consisting of chromium, titanium tungsten alloy, copper, nickel, chromium nickel alloy, nickel vanadium alloy, and nickel gold alloy.

8. The method of claim 1, wherein the solder paste comprising a tin lead alloy.

9. The method of claim 1, wherein the step of performing the solder paste fill-in process to fill the solder paste into the openings comprises screen printing.

10. A wafer bump fabrication process comprising:
   providing a wafer comprising a plurality of bonding pads and a passivation layer on a surface of the wafer and the bonding pads are exposed, wherein a surface of each bonding pad has an under bump metallurgy layer;
   forming a patterned photoresist layer on the surface of the wafer, wherein the patterned photoresist layer has a plurality of openings that expose the under bump metallurgy layer;
   performing a curing process to cure the patterned photoresist layer after the openings are formed therein;
   performing a solder paste fill-in process to fill a solder paste into the openings;
   performing a first reflow process to form a plurality of bumps from the solder paste in the openings; and
   removing the patterned photoresist layer.

11. The method of claim 10, wherein the solder paste comprises a flux and the method further comprises:
   performing a second reflow process to bring oxide from inside of the bumps to a surface of the bumps by the flux; and
   removing the flux.

12. The method of claim 10, wherein after forming the patterned photoresist layer further comprising:
   performing a second ashing process to clean the openings.

13. The method of claim 12, wherein the solder paste comprises a flux and the method further comprises:
   performing a second reflow process to bring oxide from inside of the bumps to a surface of the bumps by the flux; and
   removing the flux.

14. The method of claim 10, wherein the curing process is performed for a duration of about five minutes to about thirty minutes in a nitrogen environment by controlling the amount of nitrogen less than 20 ppm, and heating the wafer to a temperature of about 180 degrees to about 230 degrees in Celsius.

15. The method of claim 10, wherein the reflow process is performed for a duration of about five minutes to about thirty minutes in a nitrogen environment by controlling the amount of nitrogen less than 20 ppm, and heating the wafer to a temperature of about 180 degrees to about 230 degrees in Celsius.

16. The method of claim 10, wherein a material of the under bump metallurgy layer includes one selected from the group consisting of chromium, titanium tungsten alloy, copper, nickel, chromium nickel alloy, nickel vanadium alloy, and nickel gold alloy.

17. The method of claim 10, wherein the solder paste comprising a tin lead alloy.

18. The method of claim 10, wherein the step of performing the solder paste fill-in process to fill the solder paste into the openings comprises screen printing.

* * * * *